July 27, 1965 WEN YUAN PAN 3,197,708

AGC PARAMETRIC AMPLIFIER WITH CONSTANT OUTPUT SIGNAL LEVEL

Filed Jan. 19, 1961

INVENTOR.
WEN YUAN PAN
BY Eugene M. Whitacre
Attorney 3,197,708

AGC PARAMETRIC AMPLIFIER WITH CONSTANT OUTPUT SIGNAL LEVEL

Wen Yuan Pan, Haddon Heights, N.J., assignor to Radio Corporation of America, a corporation of Delaware
Filed Jan. 19, 1961, Ser. No. 83,713
6 Claims. (Cl. 330—4.9)

Figure 1:
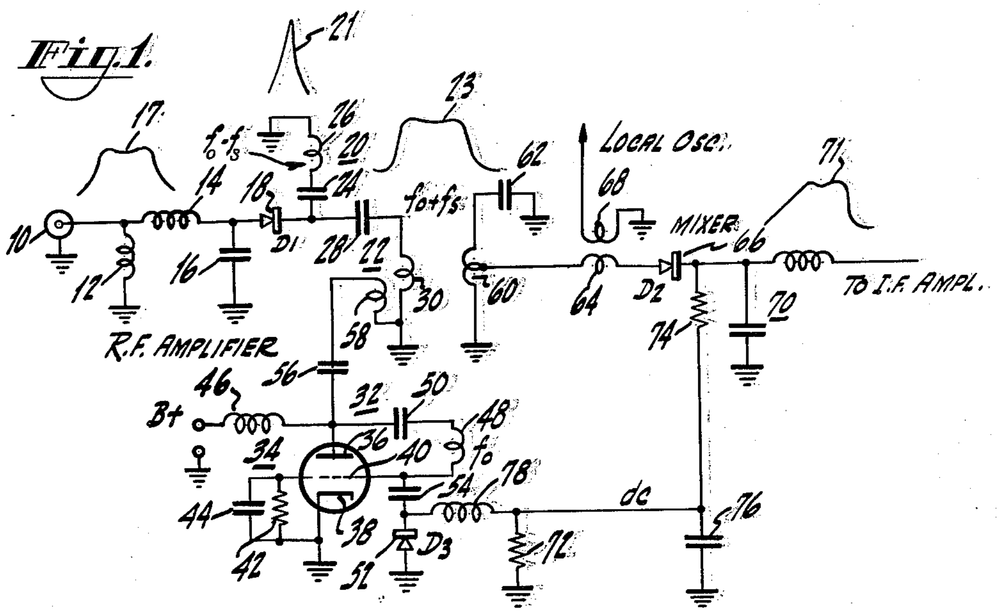

This invention relates to amplifiers of electrical signal wave energy, and more particularly to amplifiers of the type using a non-linear reactance device as the active circuit element thereof.

Amplifiers which make use of a non-linear reactance device to effect signal amplification are known as parametric or reactance amplifiers, and are discussed in Coupled Mode and Parametric Electronics, by William H. Louisell, John Wiley, 1960. In its simplest form, a parametric amplifier comprises a non-linear reactance device, a pump oscillator, and associated resonant circuits tuned respectively to the frequency of an input signal to be amplified, the pump oscillator signal, and an idler signal.

The idler signal which has a frequency corresponding to one of the side bands resulting from the interaction of the input signal to be amplified and pump signal in the non-linear reactance device is developed in the idler circuit and has an amplitude determined by the pump and input signal amplitudes. The idler signal reacts back on the non-linear reactance device and, in conjunction with the pump signal, generates a time varying reactance in the device at the signal frequency. This action tends to drive the signal input circuit, and if the signals produced are in phase with the initial signal, energy is added and the circuit behaves as a regenerative amplifier.

The parametric amplifier is essentially a small signal device and ordinarily does not have the ability to handle large signals. For larger input signal amplitudes the parametric amplifier may overload and produce distortion and effective compression of modulation components of the applied signal. Furthermore, large amplitude signals which are translated through the parametric amplifier stage may tend to overload succeeding amplifier stages thereby causing further distortion as well as other undesirable effects.

An object of this invention is to provide an improved amplifier of electrical signal wave energy using a non-linear reactance device as the active element thereof.

Another object of this invention is to provide an improved parametric amplifier capable of handling large signals, such as signals of the order of 100,000 microvolts, without distortion.

A still further object of this invention is to provide a signal receiver including an improved parametric amplifier the gain of which can be controlled as a function of the level of a received signal modulated carrier wave.

Another object of this invention is to provide an improved parametric amplifier using a variable capacitance diode as the non-linear reactance element, the gain of which may be controlled in a simple and effective manner, by an externally developed gain control voltage.

A still further object of this invention is to provide an improved high gain parametric amplifier having good stability characteristics.

A parametric amplifier in accordance with the invention includes a non-linear reactance device, such as a variable capacitance junction diode, and associated circuits respectively for the input, pump and idling signals. To reduce the gain of the amplifier and its susceptibility to distortion when strong signals are applied, the frequency of the pump oscillator is changed. In a signal receiver, the gain can be controlled as a function of the received carrier level by deriving a control voltage in suitably designed automatic gain control (AGC) circuit, and applying this voltage to a voltage responsive reactance in the frequency determining circuit of the pump oscillator.

When the frequency of the pump oscillator is adjusted for optimum gain, the idler frequency sidebands are substantially centered on the passband of the idler circuits. However, as the pump oscillator frequency is changed, the resultant side band frequencies are correspondingly changed, and are no longer centered on the passband of the idler frequency circuit. This action causes a reduction in the idler frequency currents so that there is less reaction by the idler signal on the non-linear reactance device thus resulting in less gain.

Figure 2:
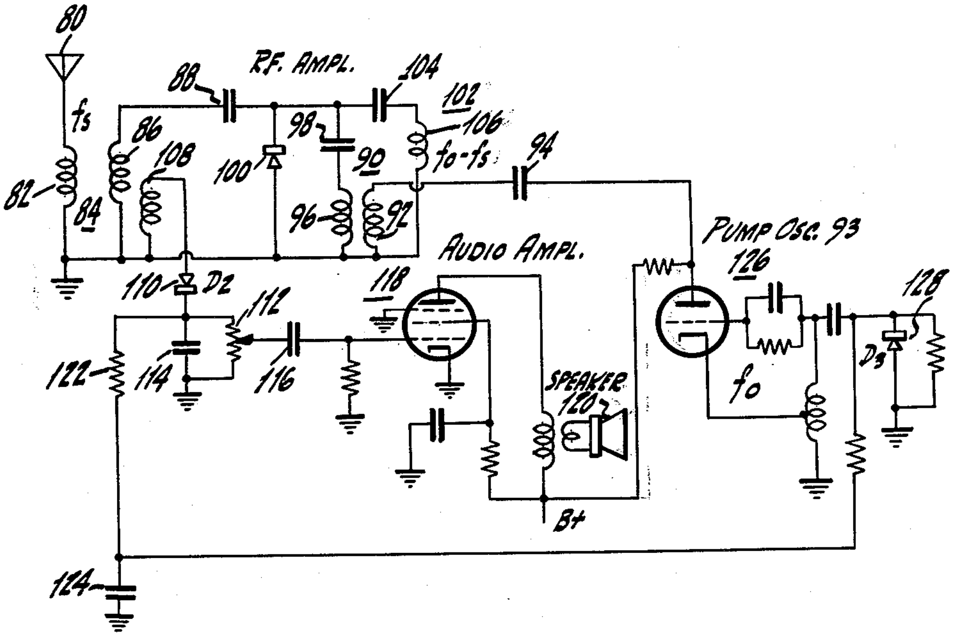

The novel features which are considered characteristic of this invention are set forth with particularity in the appended claims. The invention itself, however, both as to its organization and method of operation, as well as the additional objects and advantages thereof, will best be understood from the following description when read with the accompanying drawings in which:

FIGURE 1 is a schematic circuit diagram of a portion of a radio signal receiver such as a radar or television receiver, including a parametric amplifier embodying the invention; and FIGURE 2 is a schematic circuit diagram of a broadcast radio receiver including a modification of the parametric amplifier of the invention.

Referring to FIGURE 1, a signal to be amplified, such as a signal modulated carrier wave from an antenna or preceding amplifier, or other suitable source (not shown) is applied to a pair of input terminals 10 one of which is at ground potential. A pair of inductors 12 and 14 and a capacitor 16 are connected to the input terminals 10. The inductor 12 and the effective capacitance of the inductor 14-capacitor 16 form a parallel circuit resonant at the input signal frequency. The signal input circuit is relatively broadband, as is indicated by the bandpass curve 17, and because of the small number of components used, the insertion loss is low. The input signal appearing across the capacitor 16 is applied to a variable capacitance junction diode 18 which comprises the non-linear reactance element of the amplifier. Although the circuits of FIGURES 1 and 2 are shown as employing variable capacitance junction diodes as the non-linear reactance elements thereof, it will be recognized by those skilled in the art that other types of non-linear reactances may be used.

The diode 18 is connected from the junction of the inductor 14 and the capacitor 16 to a pair of idler circuits 20 and 22. The idler circuit 20 includes a capacitor 24 in series with an inductor 26 and the idler circuit 22 includes a capacitor 28 in series with an inductor 30.

A pump oscillator circuit 32 includes an electron tube 34 having an anode 36, a cathode 38 and a control grid 40. The control grid 40-cathode 38 circuit of the oscillator is completed through a resistor 42 and a parallel capacitor 44. Energizing potential for the triode 34 is supplied from the potential source, indicated as B+, to the anode 36 through an RF choke coil 46.

The oscillator is tuned to the desired frequency of operation by an inductor 48 which is connected from the control grid 40 to the anode 36 through a D.C. blocking capacitor 50. The inductor 48, which may comprise the distributed inductance of a transmission line, resonates with the distributed and interelectrode capacitances. The frequency of oscillation is also affected by other capacitances in the circuit including that of a voltage responsive capacitor comprising a junction diode 52 which is connected to the control grid 40 by way of a D.C. blocking capacitor 54. The capacitor 54 also serves to decouple the diode 52 from the oscillator to prevent excessive loading of the oscillator circuit by the diode 52. The pump oscillator circuit described may comprise any known circuit configuration for generating oscillations at the desired pump frequency.

Energy from the pump oscillator is coupled through a blocking capacitor 56 and an inductor 58 to the inductor 30 of the idling circuit 22. Pump oscillator energy developed across the inductor 30 is applied to the diode 18 where it is mixed with the applied input signal from the terminals 10 to produce sideband or beat frequency signals. One of the sideband signals has a frequency corresponding to the difference in frequency between the applied signal and pump frequencies and will be referred to as the difference frequency signal. Another of the sideband signals has a frequency corresponding to the sum of the applied input signal and pump frequencies and will be referred to as the sum frequency signal.

The idler circuit 20 comprises a series resonant circuit which is sharply tuned to the difference frequency signal, as is indicated by the band pass curve 21. The idler circuit 22 comprises the primary portion of a double tuned network, and is tuned to the sum frequency signal. The secondary circuit of the double tuned network comprises an inductor 60 which is also tuned to the sum frequency signal by a capacitor 62. The inductor 60 is coupled to the inductor 30, and the tuning of the primary and secondary portions of the double tuned network providing a bandpass characteristic, represented by the curve 23, which is broader than that of the idler circuit 20.

Signal energy developed in the inductor 60 is coupled through an inductor 64 to a mixer diode 66. Energy from a local oscillator, as indicated, is coupled to the diode 66 by way of the mutual coupling between an inductor 68 in the oscillator circuit and the inductor 64. The diode 66 comprises a portion of a conventional down converter circuit to reduce the sum frequency signal to the intermediate frequency of the receiver.

The resulting intermediate frequency signals which have modulation components corresponding to the modulation components of the signal applied to the input terminals 10 are applied through a filter network 70 to the remaining circuits of the receiver, not shown. The bandpass characteristic of the filter 70 is represented by the curve 71. By way of example, the circuit shown in FIGURE 1 may comprise the input circuit or "front end" of a television receiver, and may be connected to drive the IF amplifier and other successive circuits of an otherwise conventional television receiver.

The D.C. circuit for the diode 66 includes a portion of the inductor 60, the inductor 64, and a pair of resistors 72 and 74. The D.C. voltage developed across the resistor 72 has an amplitude which corresponds to the average level of a received amplitude modulated carrier wave. This voltage is filtered by a filter capacitor 76 and is applied through an RF choke coil 78 to the variable capacitance diode 52. It will be recognized that the voltage developed across the resistor 72 corresponds to an automatic gain control (AGC) voltage and may be developed in other types of gain control circuits such as a keyed or pulsed AGC circuit of the type commonly used in television receivers.

In the operation of the parametric amplifier thus far described, an input signal applied to the input terminals 10 is mixed with a pump signal from the pump oscillator 32 in the non-linear variable capacitance of the diode 18. The sum and difference sidebands which are produced as a result of this mixing are developed respectively in the idler circuits 22 and 20.

Considering parametric amplifiers generally, sum mode parametric amplifier circuits, that is parametric amplifiers having idler circuits tuned to the sum frequency signal, exhibit limited gain which is a function of a ratio of the pump frequency to the applied signal frequency. However, the sum mode operation has the advantage that a positive resistance is exhibited at the input terminals and hence the amplifier is stable. Difference mode parametric amplifier circuits, that is, parametric amplifiers having idler circuits tuned to the difference frequency signal, are not so limited as to gain, but have the disadvantage that a negative resistance is exhibited at the input terminals which causes stability problems.

A parametric amplifier circuit in accordance with the invention combines the advantages of sum and difference mode operation in a single parametric amplifier circuit by providing two idler circuits tuned respectively to the sum and difference frequency signals. This amplifier is found to be stable, and to exhibit high gain which is not limited as the function of the pump and applied signal frequencies.

The mechanism for gain in a parametric amplifier, as hereinbefore discussed, results in part due to the reaction of the idler signal on the non-linear reactance device. High gain is achieved in the circuit of FIGURE 1 in large part due to the relatively large difference-frequency signal current produced as a result of the sharp tuning of the idler circuit 20. The large difference frequency signal current reacts on the diode 18 to produce a correspondingly large gain.

Parametric amplifiers of the type described are suitable for low noise amplification of small signals. However for large signal levels such as those above 5,000 microvolts across 50 ohms at the amplifier input terminals 10, the amplifier may overload and produce distortion and compression of the modulation signal components. In addition the stronger signal which is conveyed through the amplifier tends to apply an output voltage to succeeding signal translating stages which may be of sufficient magnitude to overdrive these stages and thereby produce further distortion as well as other undesirable results.

In accordance with the invention, a parametric amplifier of the type described is adapted to handle strong input signals, on the order of 0.5 to 1.0 volt in amplitude, without distortion or overloading by changing the frequency of the pump oscillator 32. If desired a delay may be provided so that the pump oscillator is not detuned for small applied input signals, such as those up to 5,000 microvolts, and the oscillator is detuned further and further for increasing levels of applied signal voltages above the desired threshold.

To effect the detuning of the pump oscillator 32 automatically as a function of applied signal level, the A.G.C. voltage developed across the resistor 72 is applied to the diode 52. It will be noted that due to the poling of the mixer diode 66, that the voltage developed across the resistor 72 applies a reverse bias to the diode 52 which increases as the signal level increases. This causes a corresponding reduction in the capacity exhibited across the injunction of the diode 52 causing the pump oscillator frequency to increase.

As the frequency of the pump oscillator increases, the sum and difference frequency sidebands, produced by the interaction of the pump signal with the applied input signal in the diode 18, also increase. Thus the resulting sidebands, particularly the difference frequency signal sidebands are no longer centered on the passband characteristic of the idler circuits. As a result, the idler frequency currents are reduced so that there is less reaction of the idler signal on the diode 18 causing a reduction in the gain of the amplifier.

Amplifiers embodying the invention have exhibited excellent gain control characteristics for signal input voltages well in excess of 100,00 microvolts without overload or distortion. One such amplifier which was designed to amplify signals having a frequency of 200 megacycles had a pump frequency of 900 megacycles to produce sum and difference signals of 1100 and 700 megacycles respectively.

FIGURE 2 is a schematic circuit diagram of a broadcast signal reciever including a modification of a parametric amplifier described heretofore. Signals from an antenna 80 are coupled to the primary winding 82 of an input transformer 84. A secondary winding 86 of the input transformer is tuned to the desired signal frequency by a capacitor 88.

A second coupling transformer 90 includes a primary winding 92 which is coupled to a pump oscillator 93 through a D.C. blocking capacitor 94. The secondary winding 96 of the transformer 90 is connected in series with a capacitor 98 which is selected so that this circuit is resonant at the pump oscillator frequency. The signal input and pump circuits are both connected in parallel with the variable capacitance diode 100 which comprises the non-linear reactance element for the parametric amplifier.

Idler frequency signals developed as a result of the interaction of the pump and input signals in the non-linear reactance of the diode 100 are developed across an idler circuit 102 which comprise a capacitor 104 and an inductor 106 which are series resonant at the idler frequency. As is indicated in the drawings, the idler frequency corresponds to the difference in frequency between the applied input signal and pump frequency.

Amplified signal energy at the applied signal frequency is extracted by a tertiary winding 108 on the input transformer 84 and is coupled to a second detector diode 110. The diode 110 includes a load circuit including a variable resistor 112 and a signal bypass capacitor 114.

The demodulated input signal appearing across the resistor 112 is applied through a D.C. blocking capacitor 116 to an audio amplifier 118 for further amplification. The audio amplifier 118 is connected to drive a loudspeaker 120. The diode detector and audio amplifier circuits may comprise similar portions of known types of radio broadcast receivers.

The voltage appearing across the resistor 112 is filtered in a series resistor 122-shunt capacitor 124 combination to provide a D.C. voltage that varies as a function of the average received carrier level. This D.C. voltage, which corresponds to an AGC voltage, is applied to the pump oscillator 93.

The pump oscillator 93 may be of any known circuit configuration for providing a pump oscillator signal of the desired frequency. The frequency of the pump oscillator is varied by a voltage responsive reactance element indicated as a frequency capacitance diode 128. As discussed above in connection with FIGURE 1, as the D.C. voltage applied to the diode in the backward direction increases with signal level, the capacitance of the diode 128 decreases and causes the pump oscillator frequency to be increased. If desired, the control voltage can be applied to the voltage responsive reactance (diode 128) in a manner such that the pump oscillator frequency decreases to change the parametric amplifier gain.

As was described in connection with FIGURE 1 as the pump oscillator frequency is changed from the frequency for optimum amplification of an applied signal, the resultant idler sidebands are shifted in frequency away from the frequency to which the idler circuit 102 is tuned. As a result the idler frequency signal currents are reduced and the gain of a parametric amplifier decreases.

What is claimed is:

1. A parametric amplifier comprising the combination of a non-linear reactance device responsive to a control voltage to change the reactance thereof, a signal input circuit coupled to said device, means providing a pump oscillator coupled to said device, an idler circuit coupled to said device and tuned to the frequency of a sideband produced by the interaction of signals from said signal input circuit and said pump oscillator, and means responsive to the level of said signal from said input circuit for changing the frequency of said pump oscillator to change the gain of said amplifier as an inverse function of the amplitude of signals applied to said signal input circuit and provide output signals of substantially constant amplitude from said amplifier.

2. A parametric amplifier comprising the combination of a non-linear reactance device, a signal input circuit coupled to said device, a pump oscillator coupled to said device, a first idler circuit tuned to the sum of said pump oscillator and signal frequencies, a second idler circuit tuned to the difference of said pump oscillator and signal frequencies, means coupling said first and second idler circuits to said device, signal level responsive means coupled to said pump oscillator for varying the frequency of said oscillator as a function of said signal level to change the gain of said amplifier as an inverse function of the amplitude of signals applied to said signal input circuit and maintain a substantially constant output signal level from said amplifier.

3. A parametric amplifier as defined in claim 2 wherein said second idler circuit is more sharply tuned than said first idler circuit.

4. A parametric amplifier comprising the combination of a variable capacitance junction diode, a signal input circuit coupled to said diode, a pump oscillator coupled to said diode, an idler circuit tuned to the frequency of a sideband produced by the interaction of signals from said signal input circuit and said pump oscillator coupled to said diode, voltage responsive means associated with said pump oscillator for controlling the frequency of oscillation thereof, means providing a control voltage source, and means for applying said control voltage to said voltage responsive means to control the frequency of said pump oscillator to change the gain of said amplifier as an inverse function of the amplitude of signals applied to said signal input circuit and maintain a substantially constant output signal level from said amplifier.

5. A parametric amplifier comprising the combination of a non-linear variable capacitance junction diode, a signal input circuit tuned to the frequency of a signal to be amplified coupled to said diode, means providing a pump oscillator coupled to said diode, an idler circuit tuned to the frequency of a sideband produced by the interaction of signals from said signal input circuit and said pump oscillator coupled to said diode, means for reducing the gain of said parametric amplifier to reduce distortion and overloading with the presence of strong signals including a voltage responsive frequency controlling means coupled to said pump oscillator, means for deriving a control voltage of a magnitude related to the level of the signal to be amplified, and means for applying said control voltage to said frequency controlling means to change the frequency of said pump oscillator away from an initial frequency by an amount related to the level of the signal to be amplified to change the gain of said amplifier as an inverse function of the amplitude of signals applied to said signal input circuit and maintain a substantially constant output signal level from said amplifier.

6. In a signal receiver of the type including automatic gain control voltage developing means; the combination comprising, a signal input circuit tuned to the frequency of a signal to be received; means providing a pump oscillator circuit including a voltage-responsive frequency determining circuit; a non-linear reactance device coupled to said signal input circuit and to said pump oscillator circuit; an idler circuit tuned to the frequency of a sideband produced by the interaction of signals from said input circuit and said pump oscillator in said device coupled to said device; said signal input, pump oscillator and idler circuits related to said non-linear reactance device to provide amplification at least at one of said idler and signal frequencies; and means for applying an automatic gain control from said developing means to said voltage responsive frequency determining circuit to change the gain of said circuit as an inverse function of the amplitude of signals applied to said input circuit for maintaining a substantially constant output signal level from said combination.

References Cited by the Examiner

UNITED STATES PATENTS

| | | | |
|---|---|---|---|
| 3,118,113 | 1/64 | Ferrar et al. | 330—4.5 |
| 3,121,844 | 2/64 | Glomb | 330—4.5 |

FOREIGN PATENTS

| | | |
|---|---|---|
| 1,081,515 | 5/60 | Germany. |
| 1,087,646 | 8/60 | Germany. |

OTHER REFERENCES

Lowry: "Radio & T.V. News," May 1957, pages 55–58 and 109.

Robinson et al.: "Proceedings of the IRE," September 1960, page 1648.

Rohde: "Wireless World," October 1961, pages 498–499.

Vodicka et al.: "Electronics," Aug. 26, 1960, pages 56–60.

ROY LAKE, *Primary Examiner.*

BENNETT G. MILLER, *Examiner.*